United States Patent
Hattori

(10) Patent No.: US 7,499,180 B2
(45) Date of Patent: Mar. 3, 2009

(54) ALIGNMENT STAGE, EXPOSURE APPARATUS, AND SEMICONDUCTOR DEVICE MANUFACTURING METHOD

(75) Inventor: Tadashi Hattori, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 205 days.

(21) Appl. No.: 10/330,081

(22) Filed: Dec. 30, 2002

(65) Prior Publication Data
US 2003/0133125 A1 Jul. 17, 2003

(30) Foreign Application Priority Data
Jan. 7, 2002 (JP) .............................. 2002-000686

(51) Int. Cl.
*G01B 9/02* (2006.01)
(52) U.S. Cl. ..................................................... 356/510
(58) Field of Classification Search ................. 356/500, 356/508–511
See application file for complete search history.

(56) References Cited

U.S. PATENT DOCUMENTS

| | | | | |
|---|---|---|---|---|
| 5,151,749 A | * | 9/1992 | Tanimoto et al. ............. | 356/620 |
| 5,363,196 A | * | 11/1994 | Cameron ..................... | 356/500 |
| 6,813,022 B2 | * | 11/2004 | Inoue .......................... | 356/399 |
| 6,819,433 B2 | * | 11/2004 | Takai et al. .................. | 356/500 |
| 6,831,267 B2 | * | 12/2004 | Ishizuka ................ | 250/231.13 |

FOREIGN PATENT DOCUMENTS

JP 11-187693 7/1999

* cited by examiner

*Primary Examiner*—Hwa S Lee (Andrew)
(74) *Attorney, Agent, or Firm*—Fitzpatrick, Cella, Harper & Scinto

(57) ABSTRACT

An alignment stage includes a first plane mirror which extends in two directions substantially perpendicular to each other in order to measure the position of a stage in the translation direction and the tilt of the stage in the direction of height, a first measurement unit which irradiates the plane mirror with a laser beam and measures the position of the stage in the translation direction by using reflection of the laser beam, and a second measurement unit which irradiates the first plane mirror with a laser beam and measures the position by using reflection of the laser beam at a position vertically spaced apart from the firs measurement unit in order to measure the tilt of the stage. A third measurement unit which measures the tilt of the stage with respect to the surface of the surface plate in the direction of height, and an arithmetic unit calculates the error of the first plane mirror corresponding to each position of the stage on the basis of the difference between the first tilt amount based on the difference between the measurement results of the first and second measurement units, and the second tilt amount measured by the third measurement unit. A control unit corrects the first tilt amount and drives the stage on the basis of an error obtained in advance by the arithmetic unit in accordance with a position to which the stage moves.

11 Claims, 13 Drawing Sheets

F I G. 9
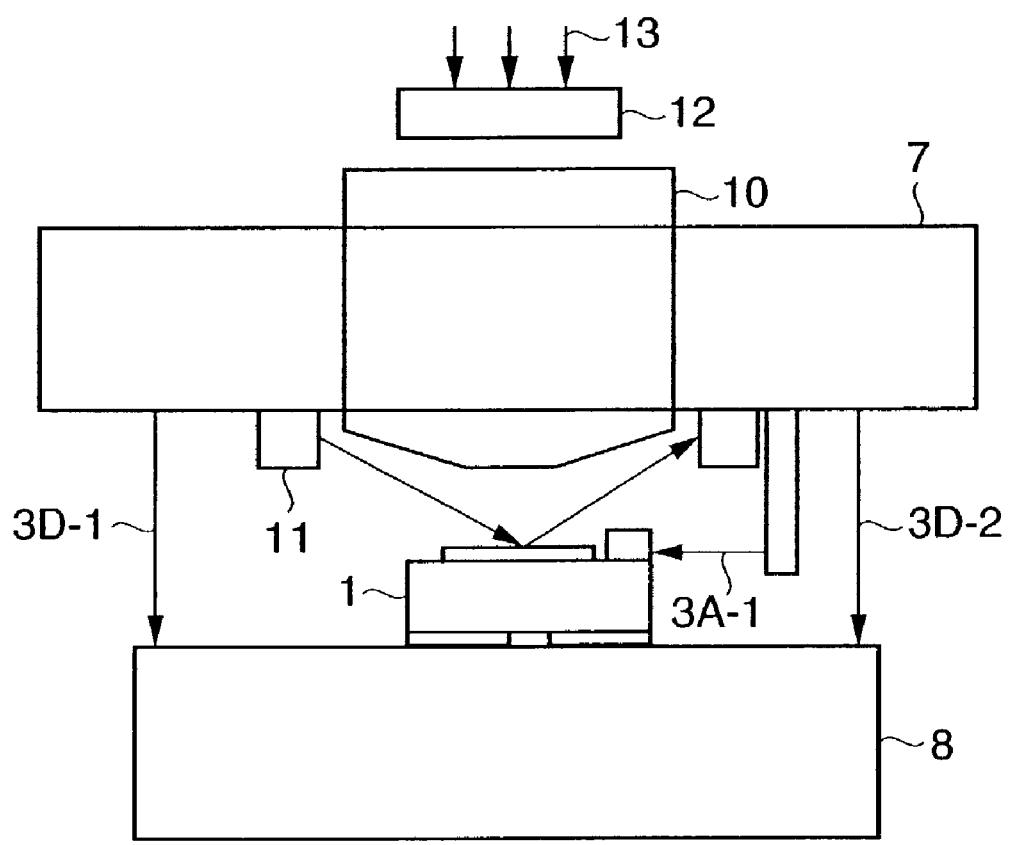

ALIGNMENT STAGE, EXPOSURE APPARATUS, AND SEMICONDUCTOR DEVICE MANUFACTURING METHOD

FIELD OF THE INVENTION

The present invention relates to an alignment stage which is used in an exposure apparatus and can be driven in a wide range at a very high precision, an exposure apparatus having the alignment stage, and a method of manufacturing a semiconductor device by using the exposure apparatus.

BACKGROUND OF THE INVENTION

A step and repeat exposure apparatus (stepper) which is a major stream as a semiconductor exposure apparatus aligns a member to be exposed (to be referred to as a "wafer" hereinafter) at a predetermined position. While keeping the wafer at rest, the stepper reduces, by a projection optical system (lens) at a predetermined magnification ratio, light (exposure light) having passed through a master (to be referred to as a "reticle" hereinafter) bearing a pattern. The stepper exposes a photosensitive agent (photoresist) applied to the wafer to light, and transfers the reticle pattern onto the wafer. The stepper repeats this operation on the entire wafer surface.

A step and scan exposure apparatus (scanner) sync-scans a wafer and reticle and exposes a wider region, compared to the stepper, which stops a wafers and exposes the wafer for every cell.

An alignment stage (to be referred to as a "wafer stage" hereinafter) which transfers a wafer, must be driven to an arbitrary position on the two-dimensional plane (X-Y plane) in a wide range at a high precision. As semiconductor circuits shrink in feature size, a higher precision is required. At the same time, the wafer stage driving region becomes much wider when, for example, the wafer diameter is large, the stage is driven to an exchange position where a wafer is exchanged, or a mark transferred onto a wafer is measured at a position other than the exposure position.

Detection of the wafer stage position generally uses a laser interferometer. The laser interferometer is arranged within the X-Y plane, and can measure the wafer stage position within the X-Y plane. For example, as shown in FIG. 1, an X-axis measurement plane mirror 2A (to be referred to as a bar mirror hereinafter) is mounted along the Y-axis on a wafer stage 1. A laser interferometer (3A-1) for measuring an X-axis position emits a laser beam almost parallel to the X-axis to the bar mirror 2A. Reflected light is caused to interfere with reference light, thereby detecting the relative driving amount of the wafer stage. This also applies to the Y-axis measurement. With two X- or Y-axis interferometers or two interferometers of each axis, the Z-axis rotation angle ($\theta z$) of the wafer stage can also be detected.

An actuator (not shown) such as a linear motor is arranged on the X-Y plane on the basis of position information obtained from the laser interferometer. The wafer stage can be driven to a predetermined position.

For a higher lens NA along with circuit miniaturization, the focus tolerance (focal depth) for transferring a reticle image onto a wafer becomes narrower, and the precision necessary for focus-direction (Z-direction) alignment becomes stricter. As for the stage, the Z direction (focus direction) perpendicular to the X-Y plane, the tilt toward the X-axis (to be referred to as Y-axis rotation, tilt, or $\theta y$), and the tilt toward the Y-axis (to be referred to as X-axis rotation, tilt, or $\theta x$) must also be measured and controlled at a high precision. For this purpose, there is proposed a method of arranging two X-axis interferometers (3A-1 and 3A-2) in the Z direction, simultaneously measuring a position, and measuring the X-direction tilt ($\theta y$) of the stage from the measurement data difference. Similarly, by arranging two Y-axis interferometers (3B-1 and 3B-2) in the Z direction, the tilt ($\theta x$) toward the Y-axis can be measured (FIG. 1).

In the wafer stage having this arrangement, the X-axis measurement bar mirror 2A (to be referred to as an "X bar mirror" hereinafter) must be longer than the driving stroke of the stage 1 along the Y-axis. A Y measurement bar mirror 2B (to be referred to as a "Y bar mirror" hereinafter) must be longer than the driving stroke of the stage 1 along the X-axis. If these bar mirrors are shorter than the strokes, reflected light of light from the laser interferometer cannot be obtained, failing in measurement. The width of the bar mirror in the Z direction must also be longer than the Z driving stroke of the stage. To measure the stage tilt component at a high precision, the interval between two laser interferometers arranged in the Z direction must be set as large as possible. Thus, the bar mirror must be designed to be sufficiently large also in the Z direction.

However, high-precision processing of the entire bar mirror in a wide area in the directions of length along the X- and Y-axes and the direction of width along the Z-axis is limited. This also increases the cost.

In addition, when a bar mirror processed at a high precision is mounted on the stage, the bar mirror is deformed by a holding force for clamping the bar mirror to the stage.

The processing precision of the bar mirror surface and the deformation in mounting influence the position measurement precision of the wafer stage. For example, when the wafer stage 1 is driven along the Y-axis, an error occurs depending on the position in the difference between measurement data by the X-axis laser interferometer (to be referred to as an "X laser interferometer" hereinafter) (3A-1) and the $\theta y$ laser interferometer (3A-2) which is a laser interferometer arranged adjacent to the X laser interferometer along the Z-axis. Assume that the tilt is $\Delta\theta y1$ for a Y-coordinate of y1. Even with this setting, when the Y-coordinate moves to y2, the Y-axis tilt varies to $\Delta\theta y2$, and the tilt $\theta y$ cannot be accurately measured.

In X-axis driving, the $\theta x$ tilt cannot be accurately measured. This measurement error of the wafer stage tilt amount appears as a shift between the wafer surface on the stage and the best focus plane of the lens. The above-mentioned lens with a shallow focal depth suffers a defocusing region (e.g., region 6B in FIG. 3) within the exposure plane. Considering an image plane 5 with respect to a wafer 4, exposure is done with the best focus in a range 6A.

Also in this case, the stationary exposure apparatus (stepper) which stops the stage and exposes the reticle pattern for every cell can finally adjust the wafer surface to the image plane by a focus sensor which measures a shift between the wafer surface on the stage and the lens image plane. To the contrary, the scanning exposure apparatus (scanner) which exposes a wafer while scanning the wafer and reticle measures the focus measurement position prior to the exposure position. The stage is driven when the measurement position reaches the exposure position. At this time, if a tilt measurement error occurs under the influence of the flatness of the bar mirror and the focus measurement position comes to the exposure position, the wafer is exposed in a defocused state, as shown in FIG. 3.

Also, the stepper erroneously measures a large focus measurement value in the presence of a tilt measurement error under the influence of the bar mirror flatness. The moving time for driving and a time loss until the stage stops decrease the throughput.

SUMMARY OF THE INVENTION

The present invention has been made to overcome the conventional drawbacks, and has as its object to provide an alignment stage and the like which can achieve high-precision alignment by correcting the measurement error of the wafer stage tilt under the influence of the plane mirror flatness. The alignment stage, according to the present invention, having an alignment stage having first driving means for driving a stage in a translation direction on a surface of a surface plate and aligning the stage within a plane, and second driving means for driving the stage in a direction of height and aligning the stage in a focus direction, comprises a first plane mirror which extends in two directions substantially perpendicular to each other in order to measure a position of the stage in the translation direction and a tilt of the stage in the direction of height, first measurement means for irradiating the first plane mirror with a laser beam and measuring the position of the stage in the translation direction by using reflection of the laser beam, second measurement means for irradiating the first plane mirror with a laser beam and measuring the position by using reflection of the laser beam at a position vertically spaced apart from the first measurement means in order to measure a tilt of the stage, third measurement means for measuring a tilt of the stage with respect to the surface of the surface plate in the direction of height, arithmetic means for calculating an error of the first plane mirror corresponding to each position of the stage on the basis of a difference between a first tilt amount based on a difference between measurement results of the first and second measurement means, and a second tilt amount measured by the third measurement means, and control means for correcting the first tilt amount and driving the stage on the basis of an error obtained in advance by the arithmetic means in accordance with a position to which the stage moves.

Another alignment stage, having an alignment stage having first driving means for driving a stage in a translation direction on a surface of a surface plate and aligning the stage within a plane, and second driving means for driving the stage in a direction of height and aligning the stage in a focus direction, comprises a first plane mirror which extends in two directions substantially perpendicular to each other in order to measure a position of the stage in the translation direction and a tilt of the stage in the direction of height, a second plane mirror which measures a tilt amount of the stage with respect to a lens barrel surface plate which supports an optical system, first measurement means for irradiating the first plane mirror with a laser beam and measuring the position of the stage in the translation direction by using reflection of the laser beam, second measurement means for irradiating the first plane mirror with a laser beam and measuring the position by using reflection of the laser beam at a position vertically spaced apart from the first measurement means in order to measure a tilt of the stage, fourth measurement means for irradiating the second plane mirror with a laser beam and measuring a tilt of the stage with respect to the lens barrel surface plate, arithmetic means for calculating an error of the first plane mirror corresponding to each position of the stage on the basis of a difference between measurement results of the first and second measurement means, and a third tilt amount measured by the fourth measurement means, and control means for correcting the first tilt amount and driving the stage on the basis of an error obtained in advance by the arithmetic means in accordance with a position to which the stage moves.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 9 is a view for explaining the schematic arrangement of a semiconductor exposure apparatus;

DETAILED DESCRIPTION OF THE PREFERRED EMBODIMENTS

Preferred embodiments of the present invention will now be described in detail in accordance with the accompanying drawings.

First Embodiment

Figure 10:
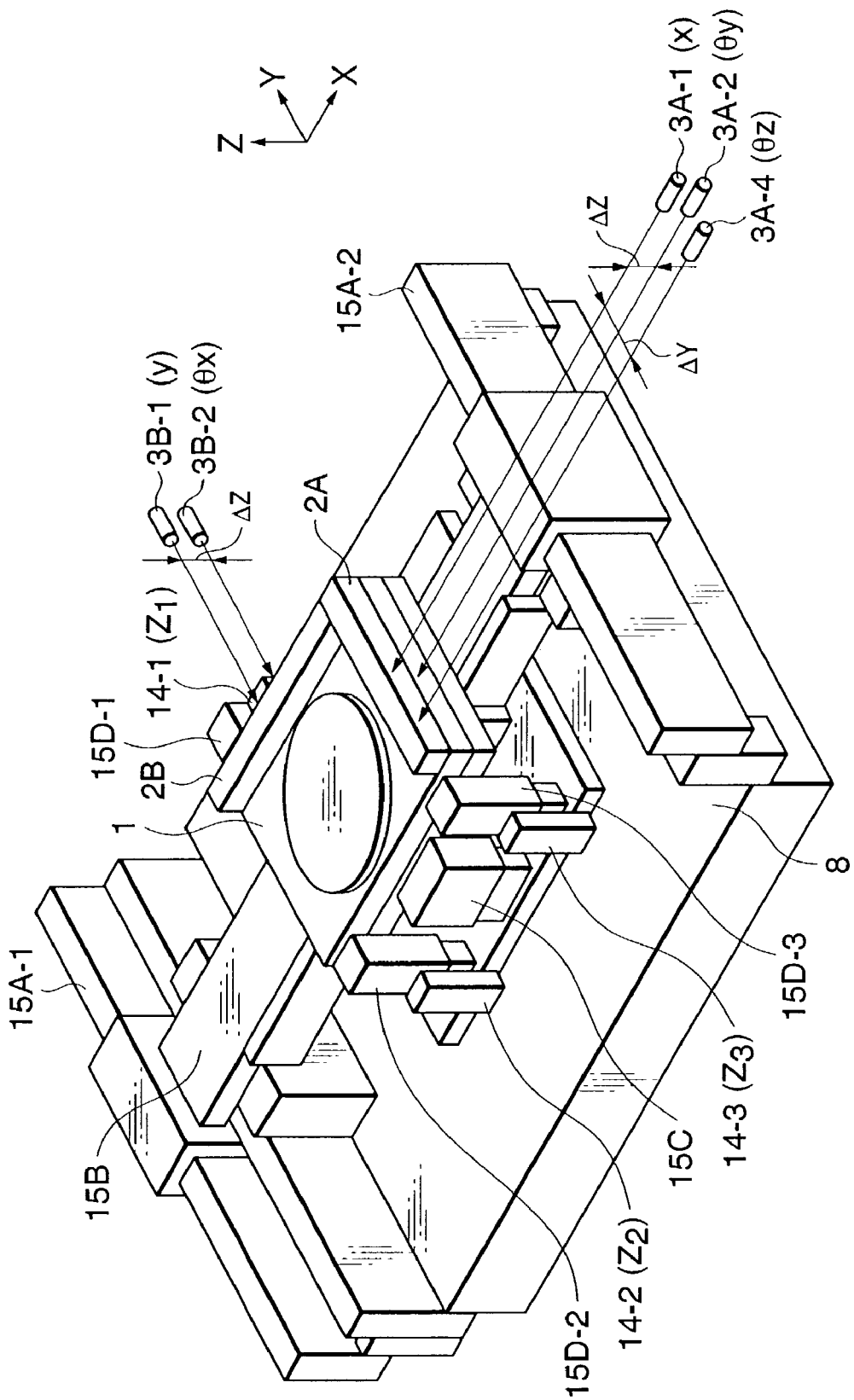
FIG. 10 is a view for explaining the arrangement of an alignment stage used in the semiconductor exposure apparatus.

The first embodiment according to the present invention will be described with reference to the accompanying drawings. A wafer stage is a combination of an X-Y stage capable of freely moving the X-Y plane, and a fine moving stage which is mounted on the X-Y stage and can be driven for tilt correction in the Z-axis and $\theta z$ directions (FIG. 10). This wafer stage realizes translation driving along the X-, Y-, and Z-axes and rotation driving about these axes ($\theta x$, $\theta y$, and $\theta z$).

X and Y positions on the wafer stage are measured by laser interferometers (3A-1 and 3B-1 in FIG. 10). The driving stroke is long in the X and Y directions. Thus, an X bar mirror (2A in FIG. 10) extending along the Y-axis is used to measure the driving position along the X-axis. A Y bar mirror (2B in FIG. 10) extending along the X-axis is used to measure the driving position along the Y-axis.

Other laser interferometers are arranged along either or both of X- and Y-axes at a horizontal interval from the laser interferometer 3A-1 or 3B-1. These laser interferometers can measure a shift amount θz in the rotation direction within the X-Y plane.

For example, a θz laser interferometer (3A-4 in FIG. 10) for measuring rotation within the X-Y plane is arranged at the same level as the X-axis laser interferometer (X laser interferometer) 3A-1 along the Z-axis at a horizontal interval (Δy) from the X laser interferometer 3A-1.

A θy laser interferometer (3A-2 in FIG. 10) for measuring Y-axis rotation of the stage is arranged below the X laser interferometer 3A-1 without any horizontal misalignment at a vertical interval (Δz) from the X laser interferometer 3A-1.

The X laser interferometer 3A-1, θz laser interferometer 3A-4, and θy laser interferometer 3A-2 can measure X-axis translation driving, rotation (θz) within the plane, and Y-axis rotation (θy) outside the plane.

Similarly, X-axis rotation (θx) of the stage outside the plane can be measured by a θx laser interferometer (3B-2 in FIG. 10) which is arranged below the X laser interferometer 3A-1 without any horizontal misalignment at a vertical interval (Δz) from the Y-axis laser interferometer (Y laser interferometer) 3B-1 and measures X-axis rotation of the stage.

Figure 1:
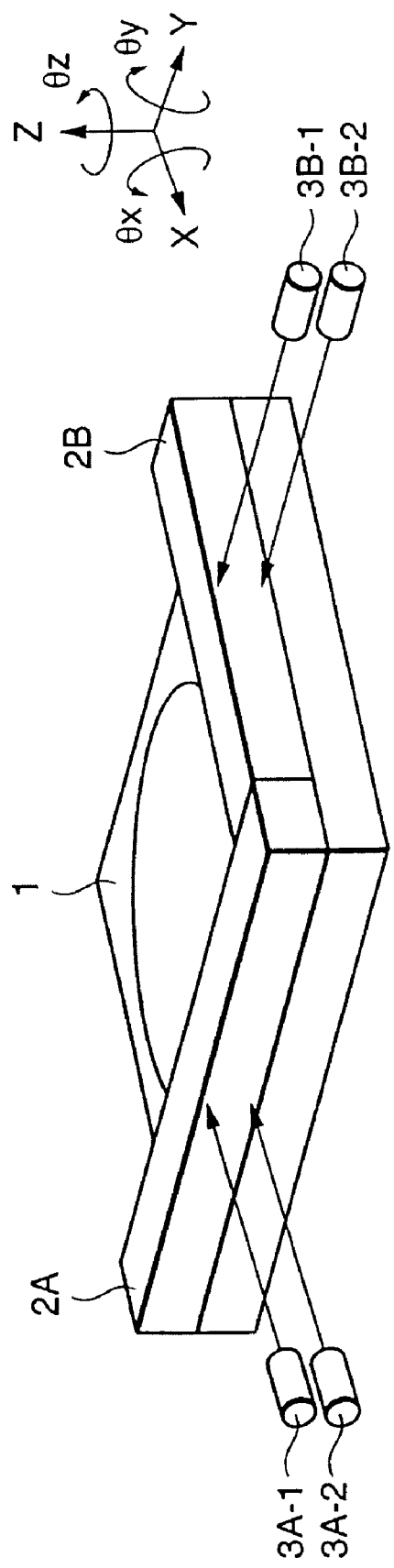
FIG. 1 is a perspective view showing the arrangement of a wafer stage capable of measuring the tilt of a wafer stage.
Figure 2:
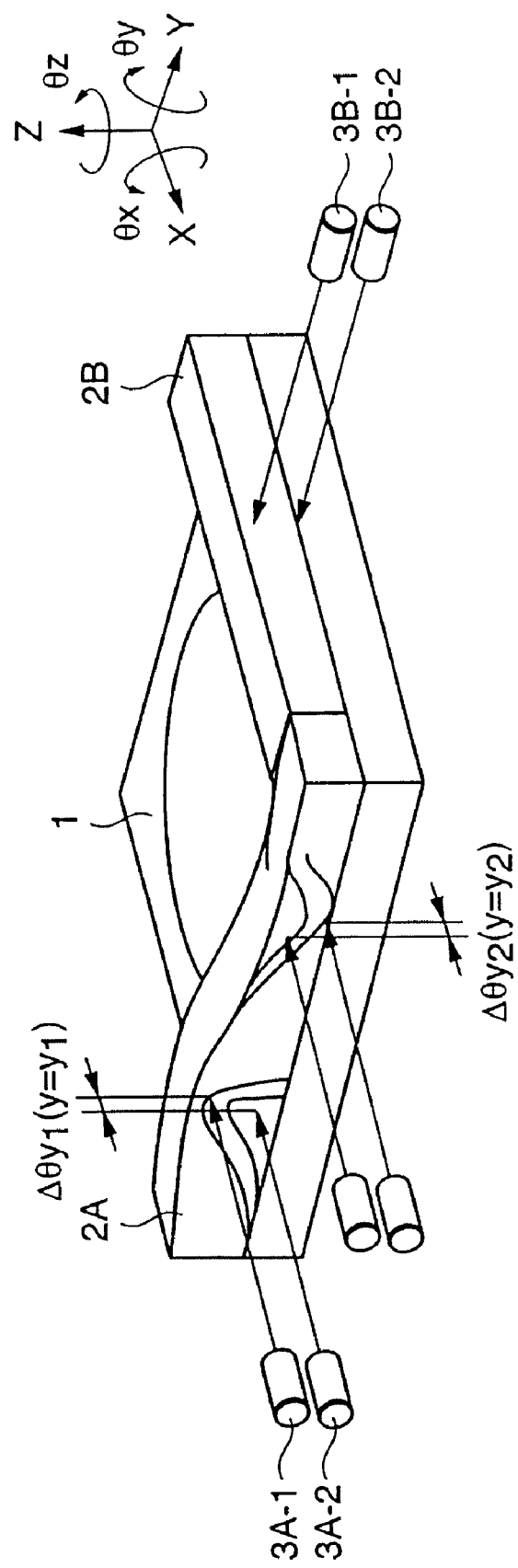
FIG. 2 is a perspective view showing the measurement of a wafer stage capable of measuring the tilt of a wafer stage.
Figure 3:
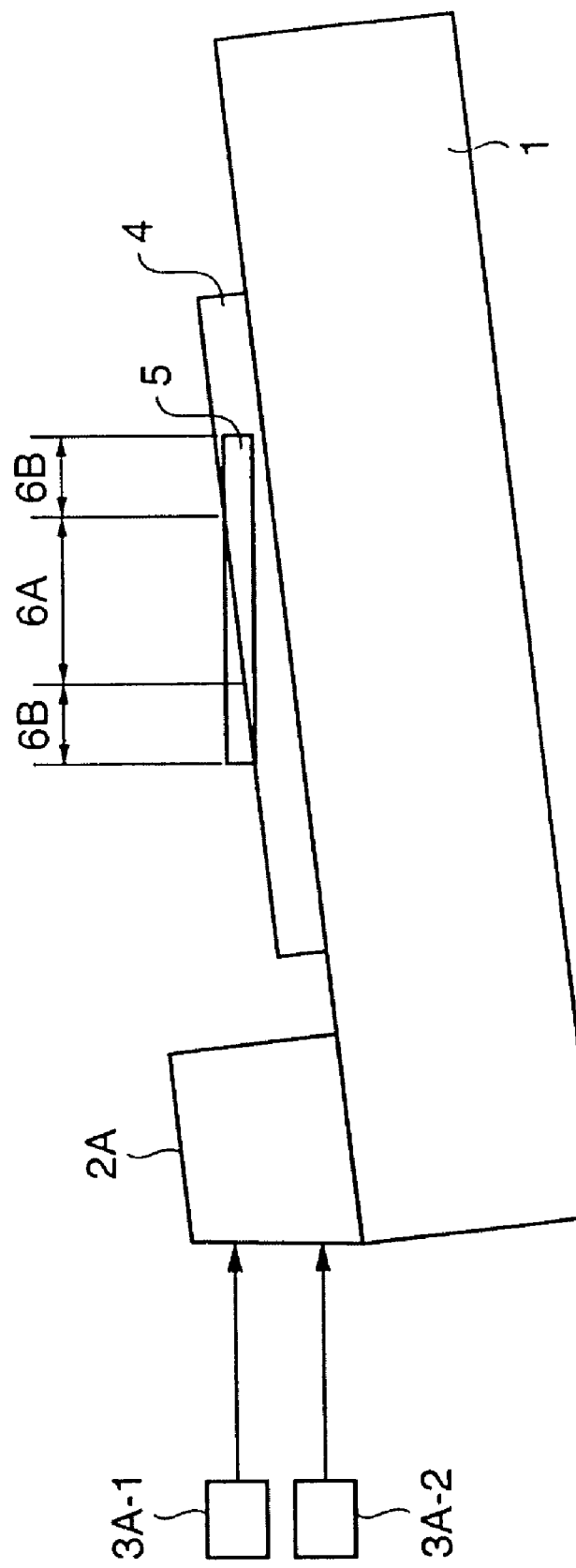
FIG. 3 is a view showing a defocusing state by the measurement error of the Y-axis rotation angle ($\theta y$)
Figure 4:
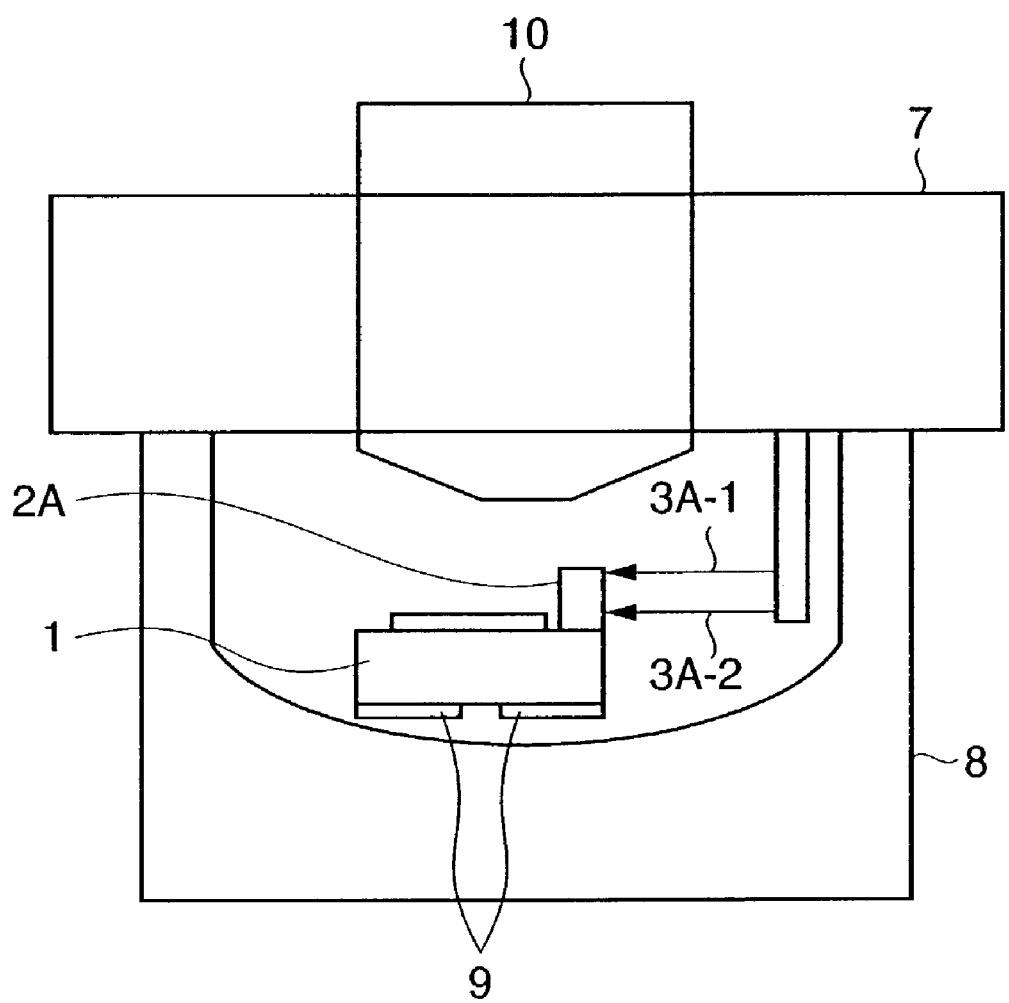
FIG. 4 is a view for explaining the influence of the surface flatness of a wafer stage surface plane on the tilt error of the wafer stage.
Figure 5:
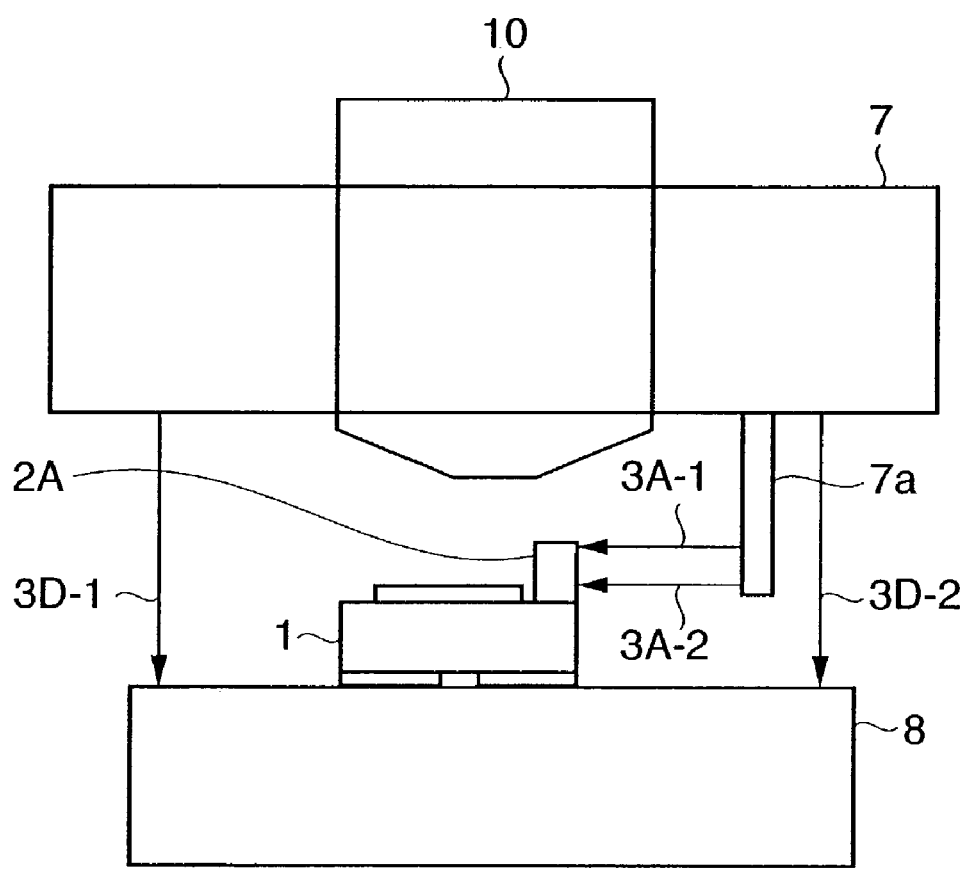
FIG. 5 is a view for explaining a structure in which a lens barrel surface plate and wafer stage surface plane are separated from each other.

The respective laser interferometers are attached to, e.g., a lens barrel surface plate 7 which supports a lens, as shown in FIGS. 4 and 5. The laser interferometers can measure the stage position with respect to the lens.

A method of measuring the Z-axis position of the wafer stage serving as a reference for obtaining the bar mirror flatness includes the following two methods.

(1) The Z-axis position is measured from a wafer stage surface plate 8. Using this position as a reference, the Z-axis position of the wafer stage is measured indirectly from the lens barrel surface plate 7. The difference between the two positions is calculated (indirect method). (2) The Z-axis stage position from the lens barrel surface plate is measured by the laser interferometers (direct method).

A method of measuring the Z-axis flatnesses of the X and Y bar mirrors will be explained in accordance with the respective Z-axis position measurement methods.

(1) Description of Indirect Method

Measurement of the Z-axis stage position from the wafer stage surface plate 8 uses linear encoders. Instead, electrostatic capacitance sensors or eddy current sensors can also be adopted as far as the precision is high even with a narrow measurement range. If the sensors are laid out in, e.g., a triangle within the X-Y plane, they can also measure rotations (θx and θy) about the axes at the same time as the Z-axis position.

Reference symbols Z1, Z2, and Z3 denote respective measurement means (14-1, 14-2, and 14-3 in FIG. 10).

For example, to measure the Z-axis flatness of the X bar mirror 2A, the Y-axis rotation angle θy is measured by the measurement means Z1, Z2, and Z3. While servo control is performed based on the measurement value so as to hold the rotation angle θy, a wafer stage 1 and the rotation angle at this position are measured by the X and θy laser interferometers 3A-1 and 3A-2. The difference between the measured rotation angle and the rotation angle (θy) measured by the measurement means Z1, Z2, and Z3 is an X bar mirror flatness error.

The flatness error value is stored in a memory as the Y-axis position function of the wafer stage 1 or a lookup table corresponding to each position. In actually driving the wafer stage, an error value corresponding to the Y-axis position of the wafer stage is obtained as a position function or lookup table data. The wafer stage position is corrected, and then the wafer stage is driven. Alternatively, the correction amount may be subtracted from or added to the measurement value of the laser interferometer, thereby correcting the measurement value in advance.

In general, the sensor such as a linear encoder is lower in measurement resolution than the laser interferometer. By setting a sufficiently large Y or X interval, the sensor can measure the tilt at a high precision. Alternatively, servo control is executed based on the measurement results of the measurement means (Z1, Z2, and Z3). Measurement by the laser interferometer is repeated a plurality of number of times to average data, thus increasing the precision.

The wafer stage 1 is two-dimensionally moved on the wafer stage surface plate (8 in FIG. 10). The above-described arrangement for measuring the Z-axis stage position from the surface of the surface plate is influenced by the surface flatness of the surface plate. In other words, the recessed/projecting surface of the wafer stage surface plate generates an error in the actual Z stage position. For example, when the wafer stage surface plate 8 is recessed, as shown in FIG. 4, the wafer stage 1 tilts under the influence of the recess.

In this case, air sliders (hydrostatic pads) (9 in FIG. 4), which guide the wafer stage surface plate 8 and wafer stage 1 in a noncontact manner, are used in a wide range on the lower stage surface. The hydrostatic pads 9 can eliminate the influence of the surface recess/projection of the surface plate 8. A large interval between the hydrostatic pads 9 can reduce the influence of the error on the tilt caused by the surface recess/projection of the surface plate.

For a higher precision, the flatness of the wafer stage surface plate 8 is measured in advance using a plurality of focus sensors, which is a method that is the subject of a previously-filed application (Japanese Patent Application No. 11-187693).

Figure 6:
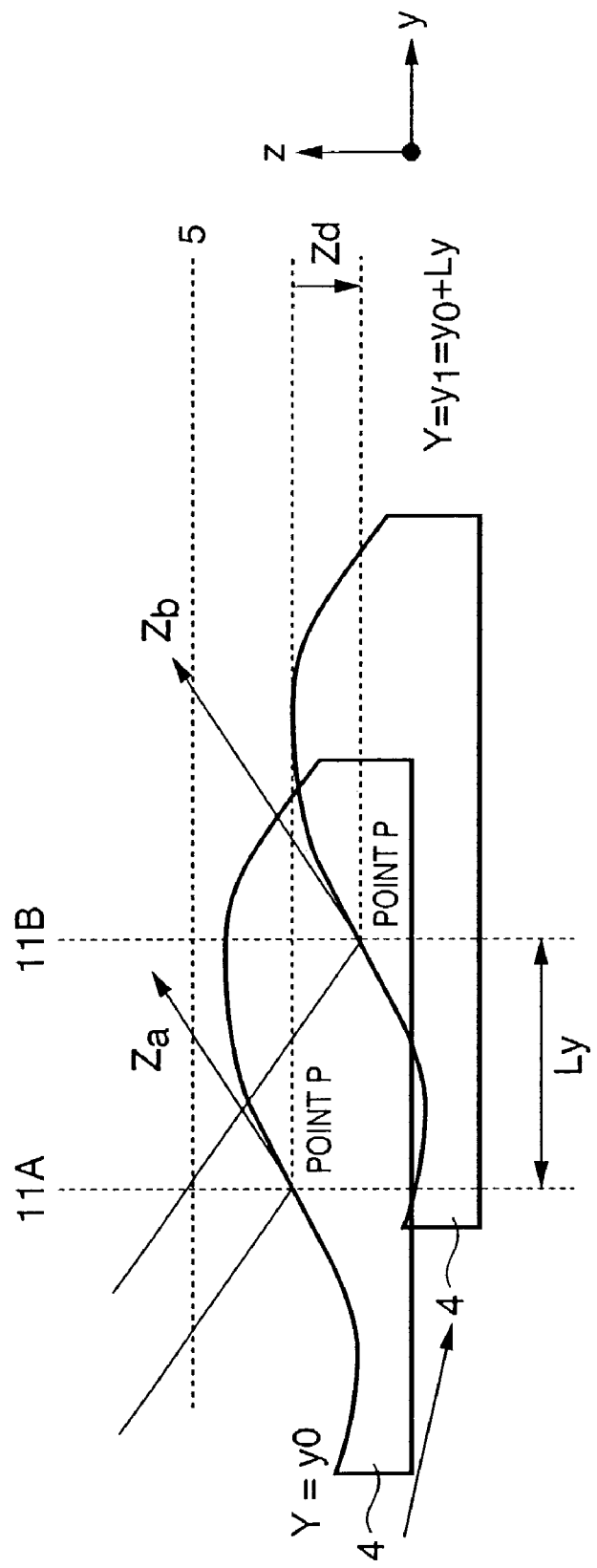
FIG. 6 is a view for explaining a method of measuring the flatness of the wafer stage surface plate.

This method will be explained briefly. As shown in FIG. 6, the same point (point P in FIG. 6) on the wafer stage surface is measured by a plurality of focus sensors 11A and 11B while the stage is driven. When the wafer stage surface plate is worked with a very high precision, i.e., when the traveling locus of the wafer stage coincides with the image plane, a plurality of focus sensors should output the same measurement value (Za and Zb). This is because the focus sensors measure the same point (point P in FIG. 6) on the wafer and the wafer recess/projection is measured to the same degree by all the focus sensors.

If a plurality of focus sensors output different measurement values (e.g., Zd in FIG. 6), this means that the stage traveling locus shifts from the image plane due to the influence of the flatness of the wafer stage surface plate. By this method, the surface recess/projection of the surface plate free from the influence of the wafer recess/projection can be measured.

For example, to measure a Z traveling error upon driving the stage in the Y direction, a plurality of focus sensors are arranged in the Y direction. The focus sensors measure the same point P on the wafer while the stage is driven in the Y direction.

By arranging a plurality of focus sensors, a tilt error depending on the stage position can also be measured. For example, to obtain a θy error upon Y driving, a plurality of focus sensors identical to those in the Y direction are also arranged in the X direction. That is, a plurality of focus sensors are two-dimensionally arranged.

If the wafer stage 1 moves, the lens barrel surface plate 7, which supports the lens, may be deformed by load variations. Then, a column 7a which supports the laser interferometer moves, generating a measurement error. To solve this problem, the lens barrel surface plate 7 and wafer stage surface plate 8 are separated from each other, as shown in FIG. 5. This structure can prevent deformation of the lens barrel surface plate caused by movement of the wafer stage position. The positional relationship between the lens barrel surface plate caused by movement of the wafer stage position. The positional relationship between the lens barrel surface plate 7 and the wafer stage surface plate 8 can be measured using sensors such as laser interferometers (3D-1 and 3D-2). The laser interferometers between the two surface plates can measure the Z-axis direction (vertical direction) and X- and Y-axis rotation angles (θx and θy) by measuring at least three portions.

As described above, the flatness error of the X bar mirror 2A can be obtained using the measurement means for measuring the Z-axis position by using the surface of the wafer stage surface plate 8 as a reference.

The flatness error of the Y bar mirror 2B can be similarly obtained. The wafer stage tilt amount can be corrected on the basis of these flatness errors.

<(2) Description of Direct Method>

According to the indirect method (1), the influence of the flatness of the wafer stage surface plate 8 and an error caused by deformation of the lens barrel surface plate 7 must be eliminated. Further, the sensors (Z1, Z2, and Z3) used as measurement means are generally lower in measurement resolution than the laser interferometer.

As the second method, a method of directly measuring the Z position of the wafer stage 1 from the lens barrel surface plate 7 will be explained.

Figure 7:
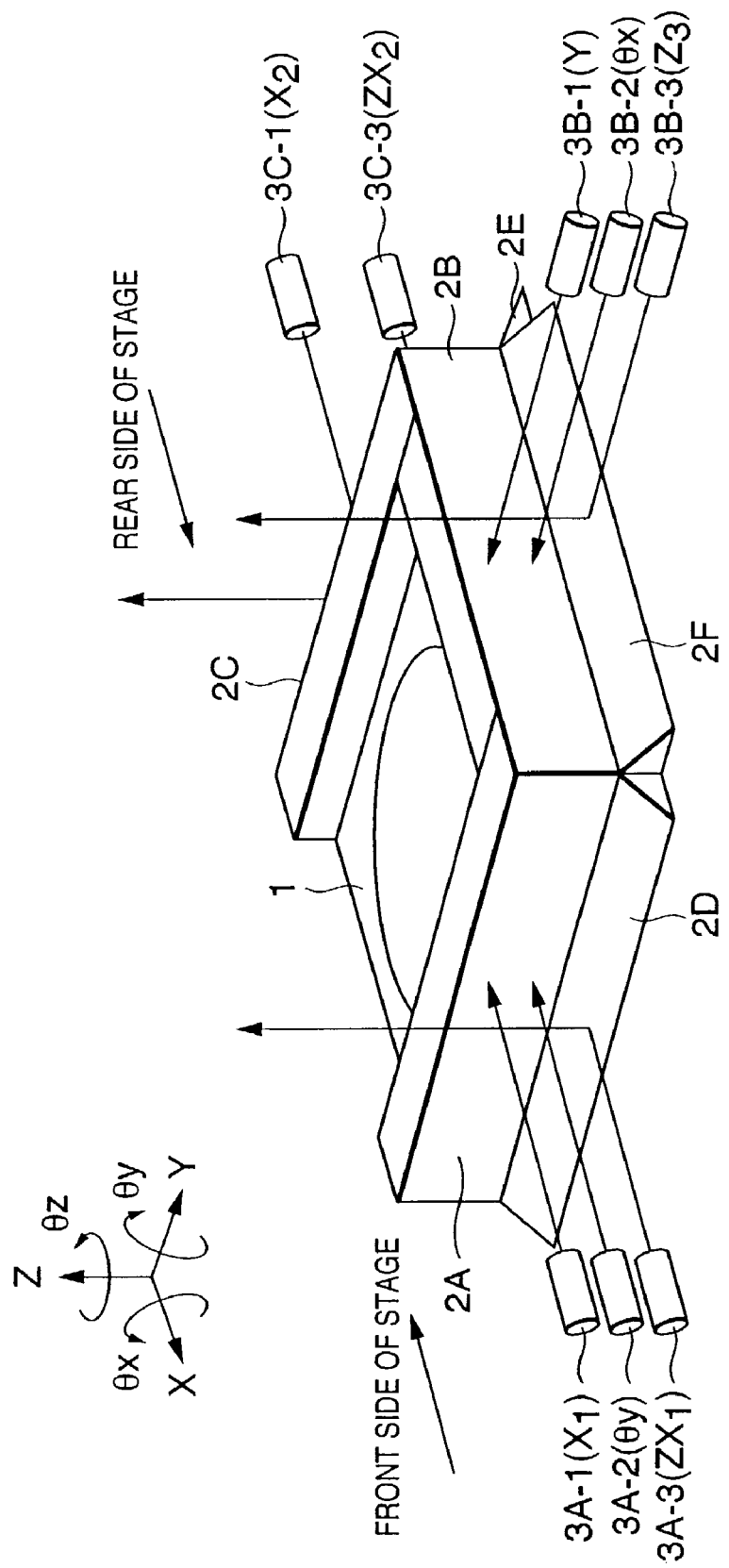
FIG. 7 is a perspective view for explaining an arrangement for measuring the tilt of the wafer stage with respect to the lens barrel surface plate.

As shown in FIG. 7, the wafer stage 1 comprises bar mirrors (2D, 2E, and 2F) inclined at 45° in addition to the X bar mirror 2A and Y bar mirror 2B. Light emitted by a laser interferometer (3A-3) from the X-axis direction impinges on the inclined bar mirror 2D. Light is then deflected vertically upward by the inclined bar mirror 2D, and travels to the lens barrel surface plate (not shown). If the surface of the lens barrel surface plate is formed from a plane mirror, light deflected vertically upward returns to the laser interferometer (3A-3) via the forward path. The Z-axis position (Y-axis rotation) can be measured from the difference between the value of the interferometer and the measurement value of the X laser interferometer (3A-1). The wafer stage tilt amount can be measured by arranging a plurality of Z-axis laser interferometers for the inclined bar mirror.

For example, in FIG. 7, two X laser interferometers (3A-1 and 3C-1) and two Z laser interferometers (3A-3 and 3C-3) are arranged on the front and rear sides of the wafer stage. A Z laser interferometer (3B-3) is also arranged in the Y direction. The Z laser interferometers (3A-3, 3B-3, and 3C-3) can measure the Z position of the wafer stage and the X- and Y-axis rotation angles (θx and θy).

As described above, to measure a position from the surface of the lens barrel surface plate by the Z laser interferometers (3A-3, 3B-3, and 3C-3), a reflecting plane must be formed in a wide range on the lens barrel surface plate side. In practice, a lens, off-axis scope, a focus sensor, or the like is mounted on the surface of the lens barrel surface plate. It is, therefore, difficult to perform measurement by a plurality of Z laser interferometers (3A-3, 3B-3, and 3C-3) on the entire X-Y moving plane of the wafer stage. In general, any one of the Z laser interferometers can execute measurement, and measurement is done by switching an effective interferometer along with movement of the wafer stage.

From this, the Z-axis position is measured by an effective one of the Z laser interferometers (3A-3, 3B-3, and 3C-3), and the tilt amount is measured by the θx and θy interferometers (3B-2 and 3A-2). The influence of the Z flatnesses of the X and Y bar mirrors (2A and 2B) cannot be ignored.

In this case, the flatness error is measured, and the error component is fed back to posture control of the wafer stage. For example, in measuring the Z flatness of the Z bar mirror 2A, the Y-axis rotation angle θy is measured by the laser interferometers 3A-3 and 3C-3. Servo control is so executed as to hold the measurement value (rotation angle θy). In this state, while the wafer stage is moved along the Y-axis, the position of the wafer stage and the rotation angle at this position are measured by the X laser interferometer 3A-1 and θy laser interferometer. The difference between the measured rotation angle and the rotation angle (θy) measured by the laser interferometers (3A-3 and 3C-3) is the flatness error of the X bar mirror 2A.

At this time, the laser interferometers 3A-3 and 3C-3 are always measurable in the moving range of the wafer stage within the X-Y plane.

The measurement values of the laser interferometers 3A-3 and 3C-3 are influenced by the flatness of the inclined bar mirror and that of the plane mirror (not shown) attached to the lens barrel surface plate. In this case, a large interval between the laser interferometers 3A-3 and 3C-3 can decrease the θy error.

Alternatively, the θy error upon moving the stage in the Y direction may be obtained in advance by the above-mentioned method (FIG. 6) of measuring the surface plate flatness by using a plurality of focus sensors. In this case, the measurement value is an error under the influence of not the surface plate flatness, but the flatness of the inclined bar mirror and that of the plane mirror of the lens barrel surface plate. In measuring the Z flatness of the X bar mirror, the error component is considered in calculation to correct the error.

The same measurement can also be applied to the Y direction. More specifically, the X-axis rotation angle (θx) may be measured by the laser interferometers 3A-3, 3B-3, and 3C-3. Alternatively, a laser interferometer (not shown) may be arranged at a position where it faces the laser interferometer 3B-3 along the Y-axis, and the same measurement as that for the X-axis may be performed. The Z-axis flatness error of the Y bar mirror 2B can be corrected.

Even in the absence of any inclined bar mirror, the flatnesses of the X and Y bar mirrors can be satisfactorily measured by the following arrangement.

Figure 8:
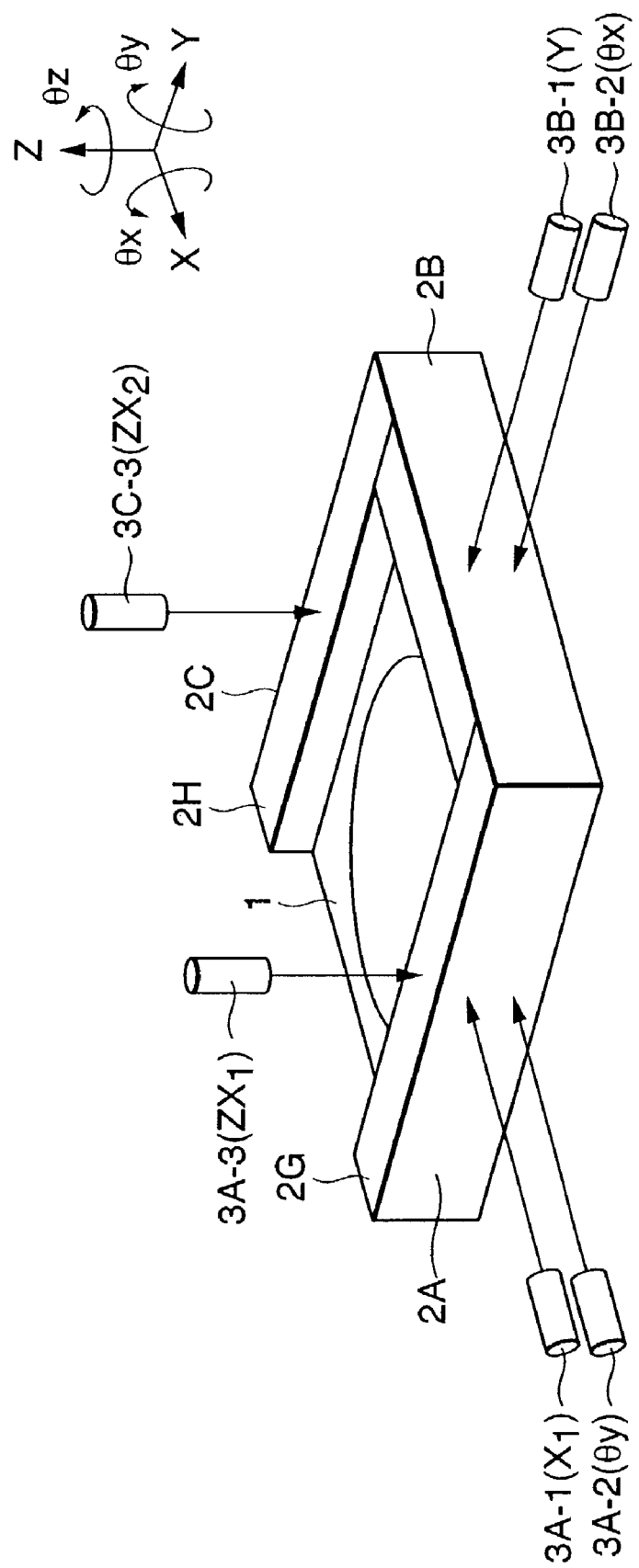
FIG. 8 is a perspective view for explaining another arrangement for measuring the tilt of the wafer stage with respect to the lens barrel surface plate.

For example, the flatness of the X bar mirror is measured, as shown in FIG. 8. At this time, the tilt amount is measured, and servo control is so performed as to hold this state. While the wafer stage is moved in the Y direction, the difference between the measurement values of the X laser interferometer 3A-1 and θy laser interferometer 3A-2 is calculated. The measurement value difference is the Z flatness of the X bar mirror.

A sensor for measuring the tilt component in order to control the tilt amount will be considered. As shown in FIG. 8, Z bar mirrors (2G and 2H) which extend in the Y direction, are arranged on the wafer stage. The Z bar mirrors 2G and 2H are measured by the laser interferometers (3A-3 and 3C-3) attached to the lens barrel surface plate. If the laser interferometers (3A-3 and 3C-3) are parallel to the X-axis, the Y-axis rotation angle (θy) can be calculated by equation (1) without any influence of the X-axis rotation angle (θx):

$$\theta y = (ZX1 - ZX2) \div Xspan \quad (1)$$

ZX1: measurement value of the laser interferometer 3A-3;
ZX2: measurement value of the laser interferometer 3C-3; and
Xspan: measurement distance between the laser interferometers 3A-3 and 3C-3.

If the laser interferometers 3A-3 and 3C-3 are not parallel to the X-axis, a laser interferometer is also prepared in the Y direction, and the X-axis rotation angle (θx) is simultaneously measured by this arrangement. Alternatively, servo control may be so executed as to hold the X-axis rotation angle by the Y laser interferometer 3B-1 and θx laser interferometer 3B-2. In this state, the wafer stage is moved along the X-axis, and the rotation direction error is obtained by difference calculation every position.

If the wafer stage moves in the X direction in measuring the Z bar mirrors 2G and 2H from above, measurement may fail. However, in order to measure the bar mirror flatness, the stage is moved to an X-coordinate position where the laser interferometers 3A-3 and 3C-3 can be simultaneously measured. The flatness of the X bar mirror 2A is measured while the stage is moved along the Y-axis.

In the use of the Z bar mirror, the measurement values of the laser interferometers 3A-3 and 3C-3 are influenced by the flatnesses of the Z bar mirrors 2G and 2H. A sufficiently large Xspan can reduce the error influence. Alternatively, the θy error upon moving the stage in the Y direction may be obtained in advance by the above-described method of measuring the surface plate flatness by using a plurality of focus sensors. In this case, the measurement value is an error under the influence of not the surface plate flatness, but the flatnesses of the Z bar mirrors 2G and 2H. In measuring the Z flatness of the X bar mirror, the error component is considered in calculation to correct the error.

The Z flatness of the Y bar mirror can also be obtained by the same method.

In this manner, the measurement error of the stage tilt caused by the Z flatness of the bar mirror is measured in advance. The error is stored in a memory means as a stage position function or lookup table data. In driving the stage, the correction amount is obtained from the function or lookup table. The stage is corrected and driven, thereby increasing the alignment precision against the stage tilt.

Second Embodiment

<General Description of Semiconductor Exposure Apparatus>

FIG. 9 is a view for explaining the schematic arrangement of a semiconductor exposure apparatus actually using the above-described stage. A method of transferring the circuit pattern of a reticle onto a wafer by using the apparatus will be explained.

A lens 10 is mounted in a lens barrel surface plate 7. The positions of reticle- and wafer-side stages are measured based on positions from this lens. That is, the positions of a reticle stage (not shown) and wafer stage 1 are measured by a laser interferometer attached to the lens barrel surface plate 7.

Exposure light 13 enters a master (to be referred to as a "reticle" hereinafter) 12 from its upper surface. By this exposure light, the circuit pattern of the reticle is reduced by the lens at a predetermined magnification, and transferred onto a wafer on the wafer stage 1. At this time, the Z direction (vertical direction) and tilt (tilt angle) of the wafer stage 1 are corrected by a focus sensor 11 attached to the lens barrel surface plate 7 so as to make the wafer surface coincide with the image plane of the lens. The wafer stage 1 is then driven. Note that the scanner transfers the pattern of the entire reticle surface onto the wafer by sync-scanning the reticle and wafer stages at almost the same ratio as the lens magnification by using slit-like exposure light passing through the lens.

After exposure of one shot, the wafer stage is stepped by almost the shot interval, and exposure is similarly repeated. This is repeated for the entire wafer surface. The semiconductor exposure apparatus has schematically been explained.

A wafer stage arrangement for aligning a wafer will be described. The wafer stage is constituted by an X-Y stage which can freely move in the X and Y directions on a wafer stage surface plate (8 in FIG. 10), and a fine moving stage which is mounted on the X-Y stage and can be driven in the Z direction, Z-axis rotation (θz) direction, and X- and Y-axis tilt (θx and θy) directions. The X-Y stage slightly floats from the wafer stage surface plate 8 by the air blow force of an air slider (hydrostatic pad), and guides the X-Y stage in a noncontact manner.

The X-Y stage is driven by two linear motors (15A-1 and 15A-2) in the Y direction. An X linear motor (15B) is arranged between the two linear motors. Using these linear motors as a driving source, the X-Y stage can be driven in a noncontact manner on the wafer stage surface plate along the guide of the air slider.

A θz rotation linear motor (15C), and linear motors (15D-1, 15D-2, and 15D-3) which can be driven in the Z direction are arranged for the fine moving stage. These linear motors function as a driving source in the θz, Z-axis translation, and tilt (θx and θy) directions.

Bar mirrors (2A and 2B) for measuring the position and tilt amount are mounted on the fine moving stage. These bar mirrors are irradiated with light from the laser interferometer, and the wafer stage position is measured by reflected light. The X measurement bar mirror extends in the Y direction, and the Y measurement bar mirror extends in the X direction.

In FIG. 10, a θz laser interferometer 3A-4 is arranged at an arbitrary interval ΔY from an X laser interferometer 3A-1 in the Y direction. The Z levels of the X and θz interferometers are desirably almost the same. The θz rotation angle (rotation shift on the X-Y plane) of the fine moving stage can be calculated by dividing the difference between the measurement values of the X and θz laser interferometers by the interval between these interferometers. The interferometer for measuring θz rotational angle may be arranged on the Y-axis side. Alternatively, θz measurement interferometers may be mounted on the X- and Y-axis sides to average measurement values, which realizes higher-precision θz measurement.

A θy laser interferometer 3A-2 is arranged at an arbitrary interval ΔZ from the X laser interferometer 3A-1 in the Z direction. The Y positions of the X and θy laser interferometers are desirably almost the same. Y-axis rotation of the wafer stage can be calculated by dividing the difference between the measurement values of the X and θy laser interferometers 3A-1 and 3A-2 by the interval between these interferometers. Also for a Y laser interferometer 3B-1, a θx laser interferometer 3B-2 may be arranged to measure the X-axis rotation angle θx of the wafer stage.

Linear encoders (14-1, 14-2, and 14-3) are respectively arranged near the linear motors 15D-1, 15D-2, and 15D-3. Each linear encoder measures a Z position from the surface of the stage surface plate to the fine moving stage. The Z-axis direction and tilt (θx and θy) amounts of the fine moving stage can be measured from the measurement values of the three sensors. The tilt amount is also measured by the laser interferometer, and the value of the laser interferometer is generally adopted. The values of the laser interferometer and sensor can be properly used.

Figure 11:
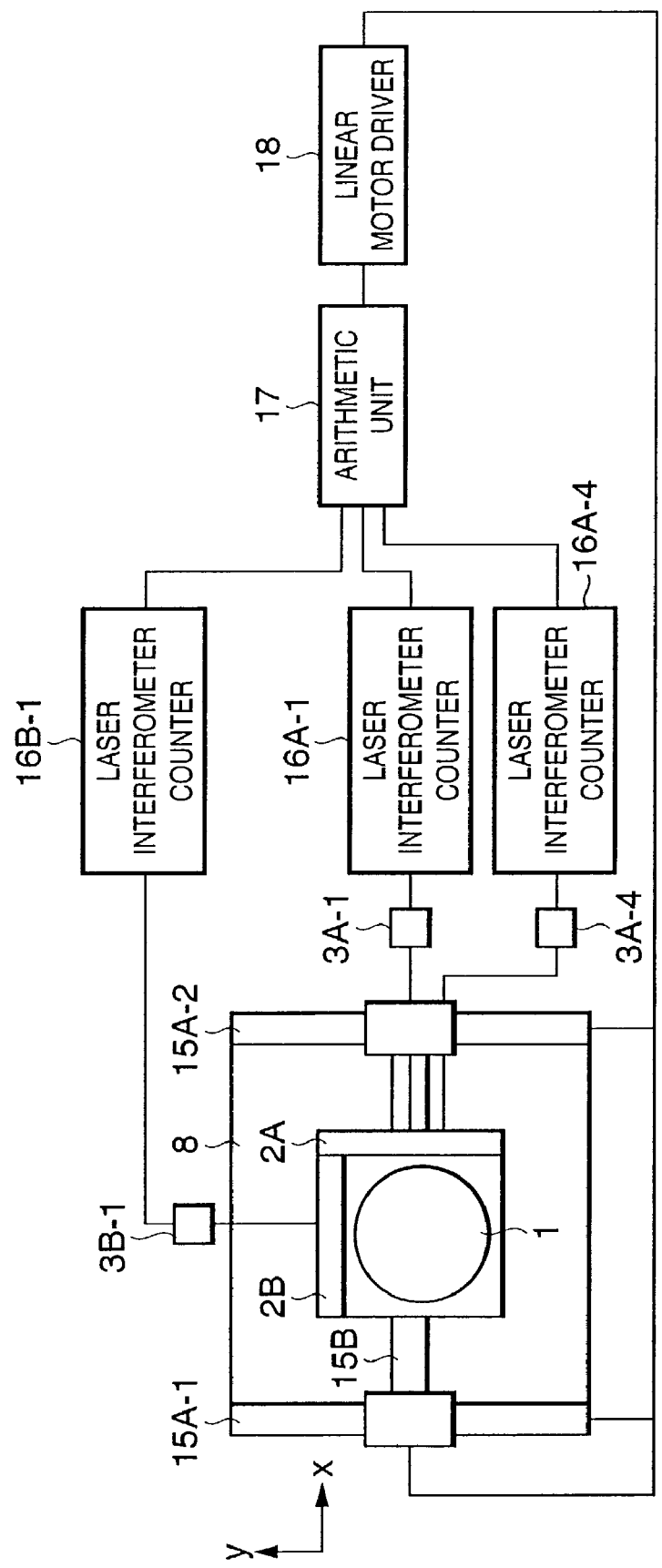
FIG. 11 is a control block diagram for controlling the alignment stage.

FIG. 11 is a control block diagram showing an information flow. FIG. 11 is a simplified view, and the actual arrangement of sensors and linear motors complies with FIG. 10. Data from the laser interferometers (3A-1, 3A-4, and 3B-1) and the like are sent to an arithmetic unit 17 via laser interferometer counters (16A-1, 16A-4, and 16B-1) and the like. The arithmetic unit 17 is a computer which incorporates a processor and memory. The arithmetic unit 17 calculates the position of each axis of the stage from measurement information obtained by the sensor, and calculates a difference from a target stage position. The arithmetic unit 17 calculates a stage driving amount from the difference, and calculates a current to be supplied to the linear motor. The arithmetic unit 17 sends the calculation result to a linear motor driver 18. The linear motor driver 18 actually supplies a current to the linear motor, thereby performing servo control of the stage position.

At this time, the arithmetic unit 17 stores the error of each sensor at the stage position. The error is, e.g., a tilt (stage tilt) error caused by the influence of the bar mirror flatness. An error such as the error of an X-axis rotation angle ($\theta x$) corresponding to the X position of the stage or the error of a Y-axis rotation angle ($\theta y$) corresponding to the Y position of the stage that is measured in advance by the above-described method is stored in a memory as a function or lookup table.

The error of the rotation angle ($\theta x$) is obtained from the function or lookup table stored in the memory on the basis of the current position (X) of the wafer stage. In driving the wafer stage, an error-corrected driving amount is determined.

In this example, only the tilt error has been described. The error includes an error, so-called Abbe error, caused by the position shift of the beam spot of the laser interferometer from a design value, a Y-axis component error at the X-axis position, and an X-axis component error at the Y-axis position.

When the target position of the wafer stage is changed from the current position to an adjacent shot position, the arithmetic unit 17 moves the target servo position of the stage close to the predetermined shot position so as to prevent the stage speed and acceleration from exceeding a predetermined value and to drive the stage at a high speed. After the stage is driven to the target shot position, the wafer surface is measured by the focus sensor. At this time, the Z and tilt differences between the wafer surface and the image plane are calculated using a plurality of focus sensors. The measurement values are sent to the arithmetic unit 17, and the arithmetic unit 17 updates the target servo positions of the Z direction and tilt of the wafer stage. The stage is then driven, and the wafer surface is made to coincide with the image plane.

The above-described example concerns a method of measuring the Z-axis position from the surface of the surface plate. The linear encoder may be replaced by a laser interferometer which measures a Z position and tilt.

<Description of Manufacturing Process>

Figure 12:
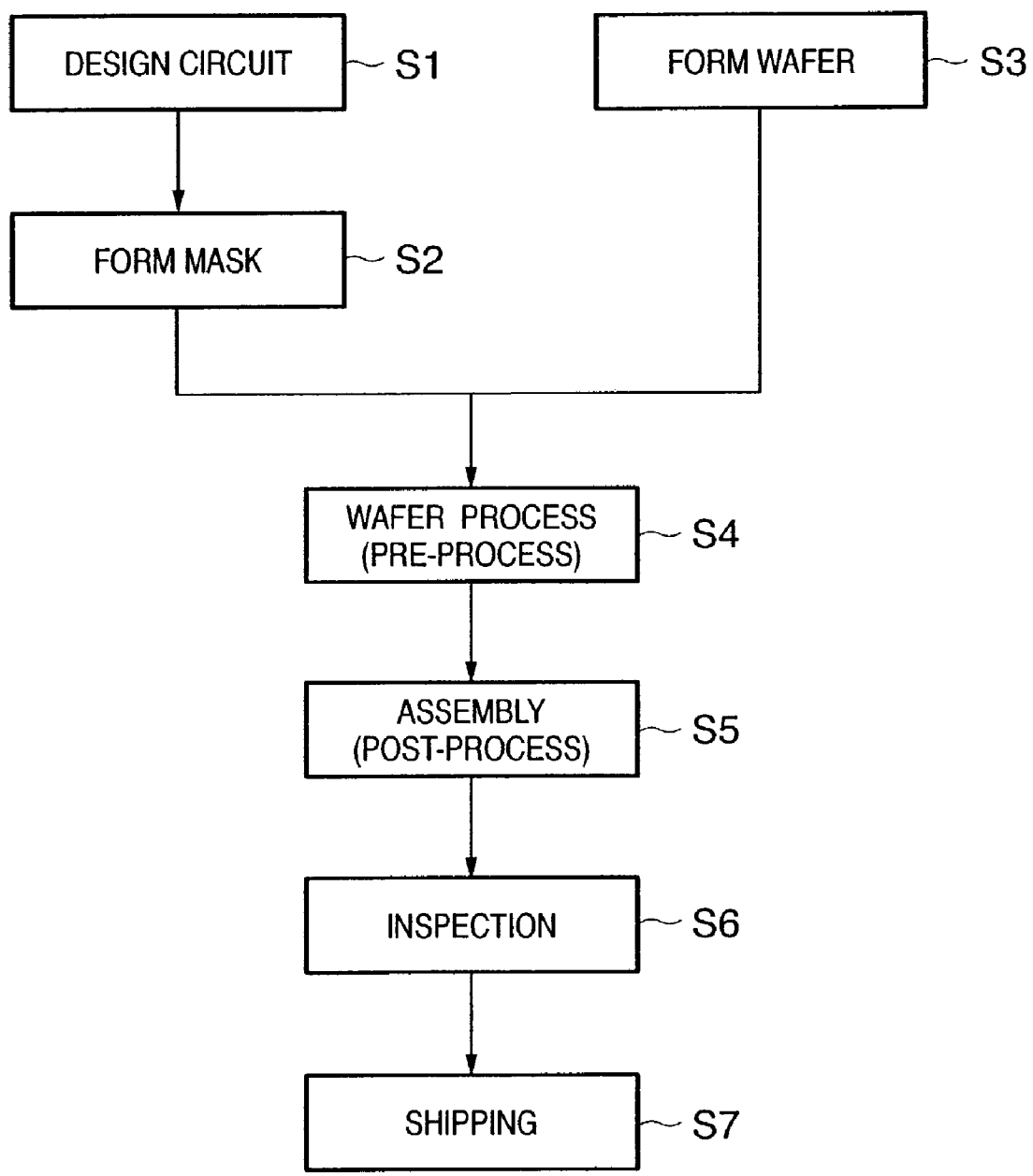
FIG. 12 is a flow chart showing the flow of the whole manufacturing process of a semiconductor device.

A semiconductor device manufacturing process using the above-described semiconductor exposure apparatus will be explained. FIG. 12 shows the flow of the whole manufacturing process of a semiconductor device. In step S1 (circuit design), a semiconductor device circuit is designed. In step S2 (mask formation), an exposure mask for the exposure apparatus is formed based on the designed circuit pattern. In step S3 (wafer formation), a wafer is formed using a material such as silicon. In step S4 (wafer process), called a pre-process, an actual circuit is formed on the wafer by lithography using the prepared mask and wafer. Step S5 (assembly), called a post-process, is the step of forming a semiconductor chip by using the wafer formed in step S4, and includes an assembly process (dicing and bonding) and packaging process (chip encapsulation). In step S6 (inspection), the semiconductor device manufactured in step S5 undergoes inspections such as an operation confirmation test and durability test. After these steps, the semiconductor device is completed and shipped (step S7).

Figure 13:
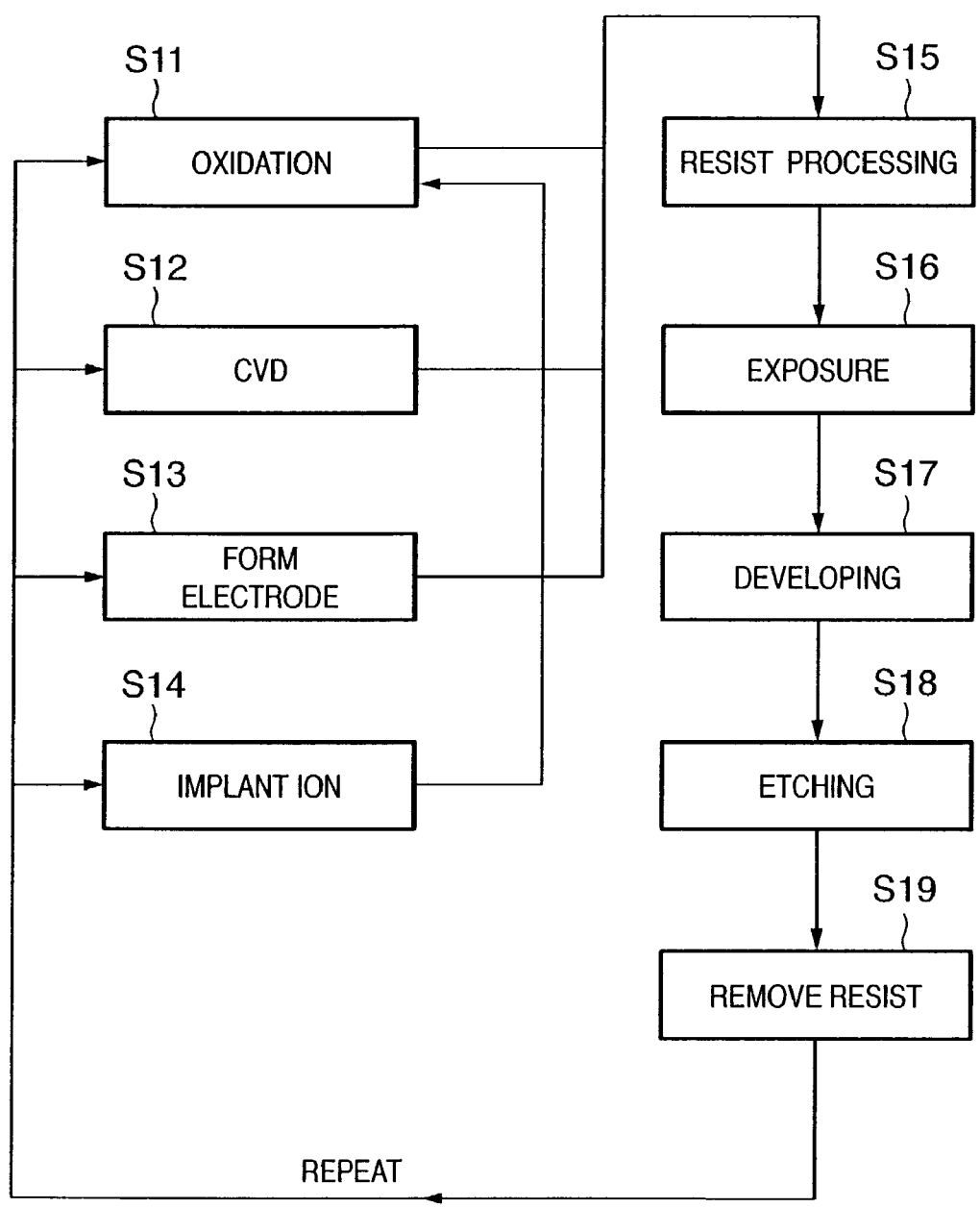
FIG. 13 is a flow chart showing the detailed flow of the wafer process.

FIG. 13 shows the detailed flow of the wafer process. In step S11 (oxidation), the wafer surface is oxidized. In step S12 (CVD), an insulating film is formed on the wafer surface. In step S13 (electrode formation), an electrode is formed on the wafer by vapor deposition. In step S14 (ion implantation), ions are implanted in the wafer. In step S15 (resist processing), a photosensitive agent is applied to the wafer. In step S16 (exposure), a circuit pattern is drawn (transferred) on the wafer by the above-mentioned exposure apparatus. In step S17 (developing), the exposed wafer is developed. In step S18 (etching), the resist is etched except the developed resist image. In step S19 (resist removal), an unnecessary resist after etching is removed. These steps are repeated to form multiple circuit patterns on the wafer.

In this way, the above-described alignment stage and the exposure apparatus using the stage are applied to the semiconductor manufacturing processing. The precision of making the wafer surface coincide with the image plane of the lens increases, and the circuit pattern of a reticle can be transferred onto a wafer without defocusing. The focus driving time and a time until the stage stops are shortened to increase the throughput.

As has been described above, a measurement error in the stage tilt caused by the error of the plane mirror is measured in advance. The measurement error is stored in a memory means as a stage position function or lookup table data. In driving the stage, the correction amount is obtained from the function or lookup table. After that, the stage is corrected and driven. This can increase the alignment precision regarding the stage tilt.

As a result, the precision of making the wafer surface coincide with the image plane of the lens increases, and the circuit pattern of a reticle can be transferred onto a wafer without defocusing. The focus driving time and a time until the stage stops are shortened to increase the throughput.

As many apparently widely different embodiments of the present invention can be made without departing from the spirit and scope thereof, it is to be understood that the invention is not limited to the specific embodiments thereof except as defined in the claims.

What is claimed is:

1. An alignment stage apparatus having a stage movable along a surface of a surface plate, said stage apparatus comprising:
   a plane mirror which extends in two directions substantially perpendicular to each other in order to measure a position of the stage in a translation direction and a tilt of the stage in the direction of height;
   first measurement means for irradiating a laser beam to said plane mirror and measuring the position of the stage in the translation direction by using reflection of the laser beam;
   second measurement means for irradiating a laser beam to said plane mirror and measuring the position of the stage by using reflection of the laser beam at a position spaced apart from said first measurement means, in the direction of height, in order to measure a tilt of the stage;

a plurality of third measurement means for measuring a tilt of the stage in the direction of height by measuring a plurality of positions in the direction of height of the stage, wherein a measurement distance in which said plurality of third measurement means are arranged is larger than a distance between said first measurement means and said second measurement means;

arithmetic means for calculating, when said first measurement means, said second measurement means and said plurality of third measurement means perform the measurement while the stage moves in the translation direction, an error of a surface of said plane mirror corresponding to the position of the stage, on the basis of a difference between a first tilt amount and a second tilt amount, wherein the first tilt amount is obtained by calculating a difference between a measurement result measured by said first measurement means and a measurement result measured by said second measurement means, and the second tilt amount is obtained based on measurement results measured by said plurality of third measurement means; and control means for correcting the first tilt amount based on the error calculated by said arithmetic means and controlling a driving of the stage based on the correction result.

2. The stage apparatus according to claim 1, wherein the error of said plane mirror calculated by said arithmetic means is stored in memory means as one of a function corresponding to a position of the stage and a lookup table.

3. The stage apparatus according to claim 2, wherein said control means obtains the error of said first plane mirror from one of a function and a lookup table stored in memory means in accordance with the position of the stage, and controls a control amount of the second driving means on the basis of the error.

4. The stage apparatus according to claim 1, wherein the stage is guided above the surface of the surface plate in a noncontact manner by a hydrostatic pad.

5. The stage apparatus according to claim 1, wherein said third measurement means includes at least one of a linear encoder, an electrostatic capacitance sensor, and an eddy current sensor.

6. An exposure apparatus comprising:
   (a) projection optical means for reducing a circuit pattern of a master at a magnification by exposure light and projecting the circuit pattern onto a wafer; and
   (b) an alignment stage which holds the wafer, controls a position and a tilt angle, and aligns the wafer in order to transfer onto the wafer the circuit pattern projected by said projection optical means, said alignment stage having a stage movable along a surface of a surface plate, and said alignment stage comprising:
      (i) a plane mirror which extends in two directions substantially perpendicular to each other in order to measure a position of the stage in a translation direction and a tilt of the stage in the direction of height;
      (ii) first measurement means for irradiating a laser beam to said plane mirror and measuring the position of the stage in the translation direction by using reflection of the laser beam;
      (iii) second measurement means for irradiating a laser beam to said plane mirror and measuring the position of the stage by using reflection of the laser beam at a position spaced apart from said first measurement means, in the direction of height, in order to measure a tilt of the stage;
      (iv) a plurality of third measurement means for measuring a tilt of the stage in the direction of height by measuring a plurality of positions in the direction of height of the stage, wherein a measurement distance in which said plurality of third measurement means are arranged is larger than a distance between said first measurement means and said second measurement means;
      (v) arithmetic means for calculating, when said first measurement means, said second measurement means and said plurality of third measurement means perform the measurement while the stage moves in the translation direction, an error of a surface of said plane mirror corresponding to the position of the stage, on the basis of a difference between a first tilt amount and a second tilt amount, wherein the first tilt amount is obtained by calculating a difference between a measurement result measured by said first measurement means and a measurement result measured by said second measurement means, and the second tilt amount is obtained based on measurement results measured by said plurality of third measurement means; and
      (vi) control means for correcting the first tilt amount based on the error calculated by said arithmetic means and controlling a driving of the stage based on the correction result.

7. The exposure apparatus according to claim 6, wherein the error of said plane mirror calculated by said arithmetic means is stored in memory means as one of a function corresponding to a position of the stage and a lookup table.

8. The exposure apparatus according to claim 7, wherein said control means obtains the error of said first plane mirror from one of a function and a lookup table stored in memory means in accordance with the position of the stage, and controls a control amount of the second driving means on the basis of the error.

9. The exposure apparatus according to claim 6, wherein the stage is guided above the surface of the surface plate in a noncontact manner by a hydrostatic pad.

10. The exposure apparatus according to claim 6, wherein said third measurement means includes at least one of a linear encoder, an electrostatic capacitance sensor, and an eddy current sensor.

11. An alignment stage apparatus comprising:
a stage which moves in a horizontal direction;
driving means for driving said stage;
a mirror which is arranged on said stage;
first and second interferometers which irradiate two laser beams to said mirror, wherein one of said first and second interferometers is vertically spaced apart from the other, and wherein each of said first and second interferometers measures a position of a horizontal direction of said stage in order to measure a tilt of said stage relative to a vertical direction;
measurement means which has two measuring units, wherein one of said two measuring units is horizontally spaced apart from the other, and wherein each of said two measuring units measures a position of a vertical direction of said stage in order to measure the tilt of said stage;
arithmetic means for calculating a surface shape of said mirror on the basis of a difference between the tilt measured by said first and second interferometers and the tilt measured by said measurement means; and control means for controlling said driving means on the basis of outputs of said first and second interferometers and an output of said arithmetic means, wherein a horizontal distance between said two measuring units is larger than a vertical distance between said first and second interferometers.

* * * * *